United States Patent
Fischer et al.

[11] Patent Number: 5,898,453
[45] Date of Patent: Apr. 27, 1999

[54] METHOD AND APPARATUS FOR EXPOSING RECORDING MATERIAL HAVING A TEMPERATURE COMPENSATED OPTICAL ISOLATOR

[75] Inventors: Jörg Achim Fischer; Klaus Günter Leiss, both of Kiel, Germany

[73] Assignee: Linotype-Hell AG, Eschborn, Germany

[21] Appl. No.: 08/765,738

[22] PCT Filed: May 2, 1996

[86] PCT No.: PCT/DE96/00755

§ 371 Date: May 19, 1997

§ 102(e) Date: May 19, 1997

[87] PCT Pub. No.: WO96/34745

PCT Pub. Date: Nov. 7, 1996

[30] Foreign Application Priority Data

May 4, 1995 [DE] Germany ............... 195 16 057
Aug. 18, 1995 [DE] Germany ............... 195 30 395

[51] Int. Cl.$^6$ ........................................ H03C 3/08
[52] U.S. Cl. ............................. 347/255; 347/239
[58] Field of Search ............................ 347/229, 231, 347/234, 239, 248, 255, 260, 262

[56] References Cited

U.S. PATENT DOCUMENTS

| | | | |
|---|---|---|---|
| 4,231,096 | 10/1980 | Hansen et al. | 345/441 |
| 4,520,370 | 5/1985 | Fujii et al. | 347/250 |
| 4,736,382 | 4/1988 | O'Meara | 372/32 |
| 4,801,950 | 1/1989 | Frehling | 347/239 |
| 4,821,048 | 4/1989 | Hornig et al. | 347/248 |
| 4,873,536 | 10/1989 | Minowa et al. | 360/99.11 |
| 5,451,777 | 9/1995 | Blake et al. | 250/234 |

FOREIGN PATENT DOCUMENTS

| | | |
|---|---|---|
| 0 243 659 | 4/1987 | European Pat. Off. . |
| 38 12 480 A1 | 10/1989 | Germany . |

OTHER PUBLICATIONS

Patent Abstracts of Japan—JP61107317 vol. 10, No. 288 (P–502).
Patent Abstracts of Japan—JP6176409—vol. 18, No. 519 (P–1807).

*Primary Examiner*—N. Le
*Assistant Examiner*—Hai C. Pham
*Attorney, Agent, or Firm*—Hill & Simpson

[57] ABSTRACT

A method and apparatus is provided for exposing the recording material. A light beam is generated by a light source. The light beam passes through an optical isolator, through a light modulator, and then exposes recording material point-by-point and line-by-line. The modulator is activated during exposing of each line in an exposing time span, the modulator being deactivated at least at times within a return time span for each line. The optical isolator is enabled during the exposing time span. To compensate for heating of the optical isolator, the optical isolator is also activated for at least a portion of the return time span. A sum of time extents of the exposing time span and the compensation time span are approximately a constant for each line. Activation of the isolator during the compensation time span compensates for thermal effects which occur in the optical isolator as a result of activation and de-activation thereof. Thus, the optical isolator is thermally stabilized and is held at a constant temperature in the exposure time spans and in the return time spans.

17 Claims, 4 Drawing Sheets

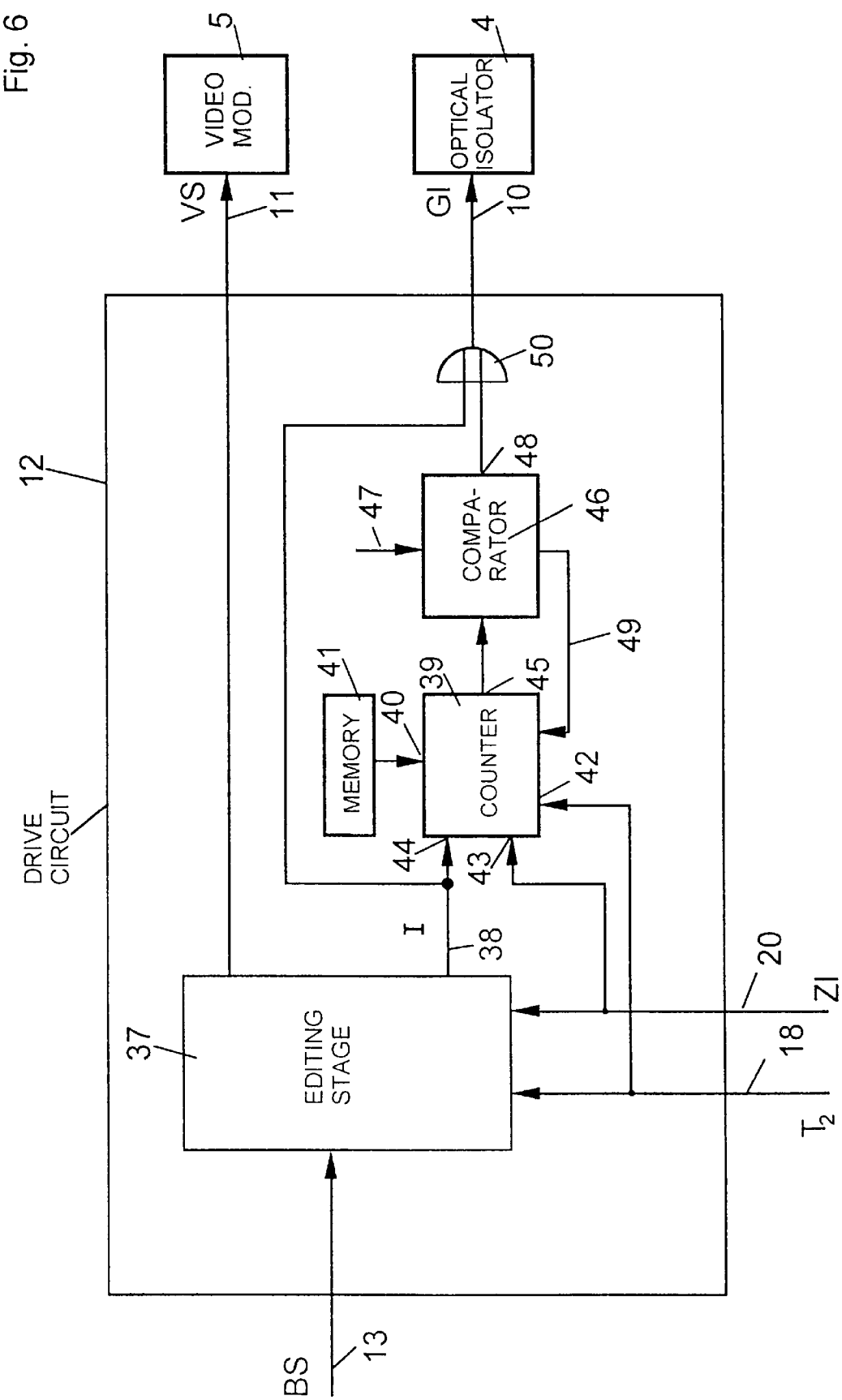

METHOD AND APPARATUS FOR EXPOSING RECORDING MATERIAL HAVING A TEMPERATURE COMPENSATED OPTICAL ISOLATOR

BACKGROUND OF THE INVENTION

The invention is in the field of electronic reproduction technology and is directed to a method for the point-by-point and line-by-line exposing of recording material with a light beam, and is also directed to an electronic exposing unit, also called an exposer, recorder or image setter.

In a recorder, a light beam modulated by a video signals is conducted point-by-point and line-by-line across a recording material to be exposed. The recording material is thereby fixed on a holder that moves relative to the light beam. Given an inside-the-drum device, the recording material is fixed on a stationary holder shaped like a cylindrical segment or on an exposure trough, and the light beam is conducted across the recording material point-by-point and line-by-line with a rotating light beam deflection means. However, the recorder can also be designed as a drum device or flat bed device.

A laser is often employed as a light source for generating the light beam. The modulation of the light beam dependent on the video signal occurs with a modulator, for example with an acousto-optical modulator. In the traditional technology, the drive of the modulator with the video signal occurs such that the modulator is activated line-by-line within exposure time spans wherein the light beam sweeps the lines to be recorded on the recording material and is deactivated during return time spans wherein the light beam is conducted to the next line to be exposed.

In a traditional recorder, back reflections from the modulator or the light beam deflection unit can disadvantageously occur in the direction toward the light source, and these must be prevented in order to achieve a good recording quality. Beyond this, a high efficiency of the modulator is required so that a light beam with high luminous power is available for exposing the recording medium. Further, the components that are employed must have optimally constant operating properties since, for example due to heating of the components, the optical properties of the light beam can vary, this in turn diminishing the recording quality.

SUMMARY OF THE INVENTION

It is therefore an object of the present invention to improve a method and an apparatus for exposing recording material such that an improved constancy of the operating properties is achieved while assuring a high efficiency.

According to the invention, a method is provided for exposing recording material wherein a light beam is generated in a light source. The light beam passes through an optical isolator and then through a video modulator where the light beam is modulated. The recording material is exposed point-by-point and line-by-line by the modulator light beam. The modulator is activated during each line of exposure in an exposing time span and is de-activated at least at times within a return time span for the light beam for each respective line. The optical isolator substantially prevents reflected light from reaching the light source. Internal heating in the optical isolator is compensated by activating the optical isolator not only during the exposing time span, but also during a compensation time span during at least a portion of the return time span. A sum of time extents of the exposing time span and the compensation time span is approximately constant for each line.

The invention is explained in greater detail below with reference to FIGS. 1 through 6.

BRIEF DESCRIPTION OF THE DRAWINGS

FIG. 6 shows an exemplary embodiment of the drive circuit in the form of a block circuit diagram.

DESCRIPTION OF THE PREFERRED EMBODIMENTS

Figure 1:
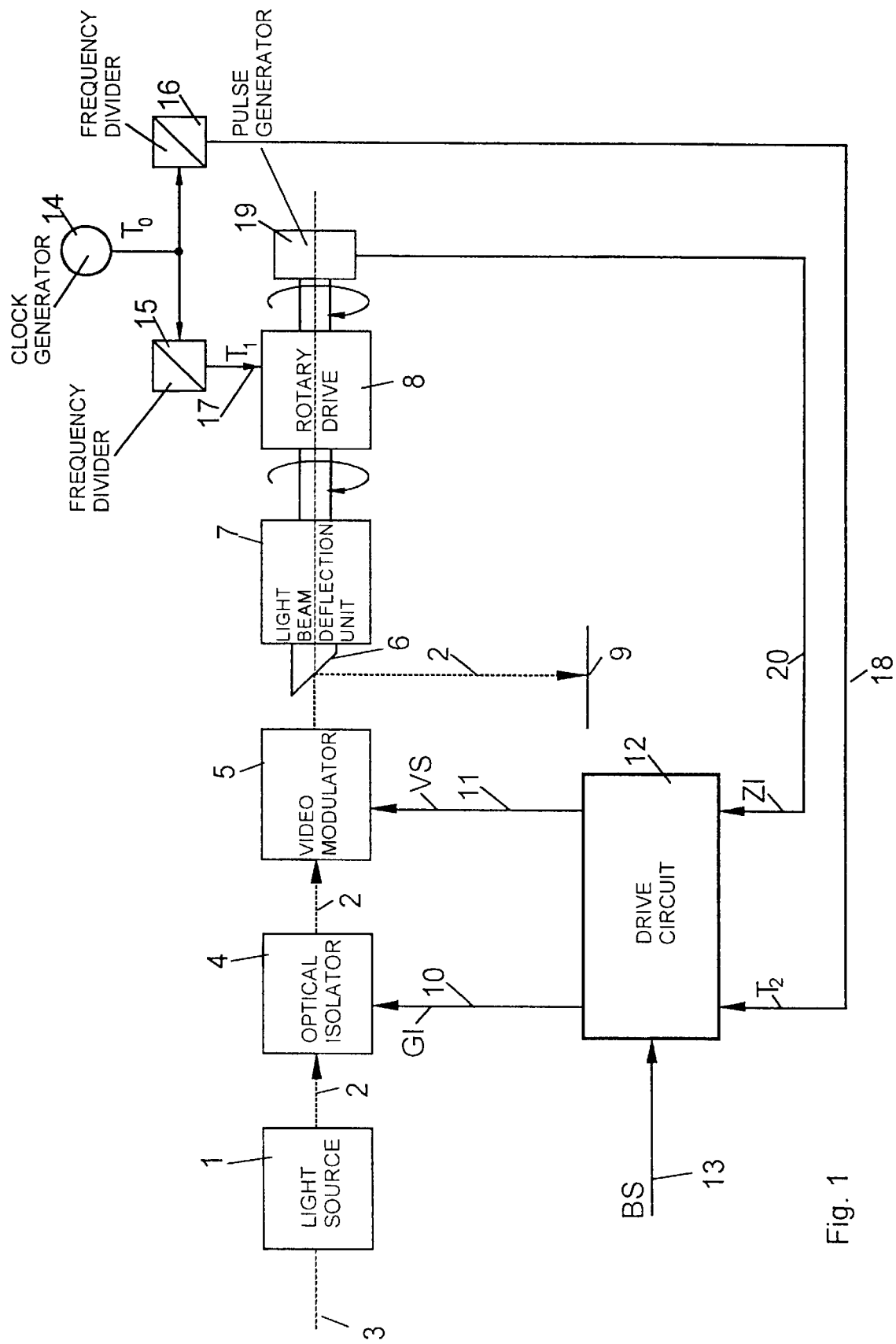
FIG. 1 is a schematic block circuit diagram of an exposure device.

FIG. 1 shows the basic structure of an electronic apparatus for the point-by-point and line-by-line exposing of recording material, referred to below as a recorder. A light source 1 generates a light beam 2 along an optical axis 3. The light beam 2 passes through a controllable optical isolator 4 and a controllable video modulator 5 that are arranged on the optical axis. A typical diameter of the light beam (2) in the region of the optical isolator amounts to 1 mm, and a focusing to a beam diameter of, for example, 70 µm occurs in the region of the video modulator 5.

The light beam 2 emerging from the video modulator 5 is incident onto a mirror 6 oriented obliquely relative to the optical axis 3 in a light beam deflection unit 7 that turns around the optical axis 3 by means of a rotatory drive 8. The light beam deflection unit 7 deflects the light beam 2 reflected at the mirror 6 across a recording material 9 to be exposed point-by-point and line-by-line in a deflection plane that proceeds perpendicularly relative to the plane of the drawing. Given a flat bed apparatus, the recording material 9 is fixed on a planar holder and, given an inside drum apparatus as shown in greater detail in FIG. 2, it is fixed to the inside surface of a stationary, cylindrical segment-shaped holder or exposure trough.

A YAG laser, for example, can be employed as light source 1. The optical isolator 4 is designed as an acousto-optical modulator of the $1^{st}$ order that is switched on and off by gate pulses GI on a line 10. The video modulator 5 is an acousto-optical modulator of the $0^{th}$ order, as a result whereof the optical modulation of the light beam 2 can be implemented with a high efficiency and with steep edges. The video modulator 5 is switched on and off by a two-level video signal (VS) on a line 11. The functioning and structure of acousto-optical modulators (AOM) are known.

The gate pulses (GI) and the video signal (VS) are generated in a drive circuit 12 from an image signal (BS) that carries the information to be recorded and that is supplied to the drive circuit 12 via a line 13.

For synchronization of the deflection motion of the light beam 2 with the signal generation in the drive circuit 12, a clock generator 14 generates a basic clock sequence $T_0$ from which a first reference clock sequence $T_1$ and a second reference clock sequence $T_2$ are derived with frequency dividers (15, 16). The reference clock sequence $T_1$ is supplied to the rotatory drive (8) for the light beam deflection means (7) via a line (17) and serves as reference value for a speed regulation. The second reference clock sequence proceeds via a line 18 to the drive circuit 12 for coordinating the signal generation. A pulse generator 19, which is coupled to the rotatory drive 8 in the illustrated exemplary embodiment, generates a line start pulse (ZI) once per revolution of the light beam deflection unit 7. The line start pulses (ZI), also referred to as a "Start-Off-Line" pulse or, abbreviated, as SOL pulses, determine the point in time in each line at which the gate pulse (GI) and the video signal (VS) are enabled for the recording. The line start pulses ZI are supplied to the drive circuit 12 via a line 20. An exemplary embodiment of the drive circuit 12 is indicated in FIG. 6.

Due to the interposition of the optical isolator 4 between light source 1 and video modulator 5, the disturbing back reflections from the video modulator 5 and the light beam deflection unit 7 onto the light source 1 cited in the introduction to the specification are advantageously prevented since the optical isolator 4 detunes the wavelengths of the back-reflected light. It is thereby assured that the light source 1 operates in stable design. Since the video modulator 5 fashioned as a modulator of the $0^{th}$ order in fact exhibits a high efficiency but cannot completely suppress the light beam 2, there is the risk of disturbing misexposures of the recording material 9. These misexposures of the recording material 9 are likewise advantageously suppressed by the optical isolator 4 in that it completely shuts the light beam 2 off in the respective exposure pauses.

Due to the activation and deactivation of the optical isolator 4 by the gate pulses (GI), thermal effects occur in the optical isolator 4 that have a negative influence on the operating properties. For example, the position of the light beam 2 can vary due to the heating of the optical isolator 4, this becoming disturbing on the exposed recording material (9) especially when the recorder works in what is referred to as start/stop mode. A recorder must always be operated in start/stop mode when it is not assured that the processor provided for editing the video signal, also referred to as raster image processor (RIP), cannot make the video signal for the modulation of the light beam continuously available with the required speed.

As a result of the temperature compensation, the optical isolator 4 is thermally stabilized in an advantageous way in that it is held at a constant temperature in the exposure time spans and in the return time spans for the light beam 2 due to the type of drive with the gate pulses (GI).

The temperature compensation of the invention is explained in greater detail below.

Figure 2:
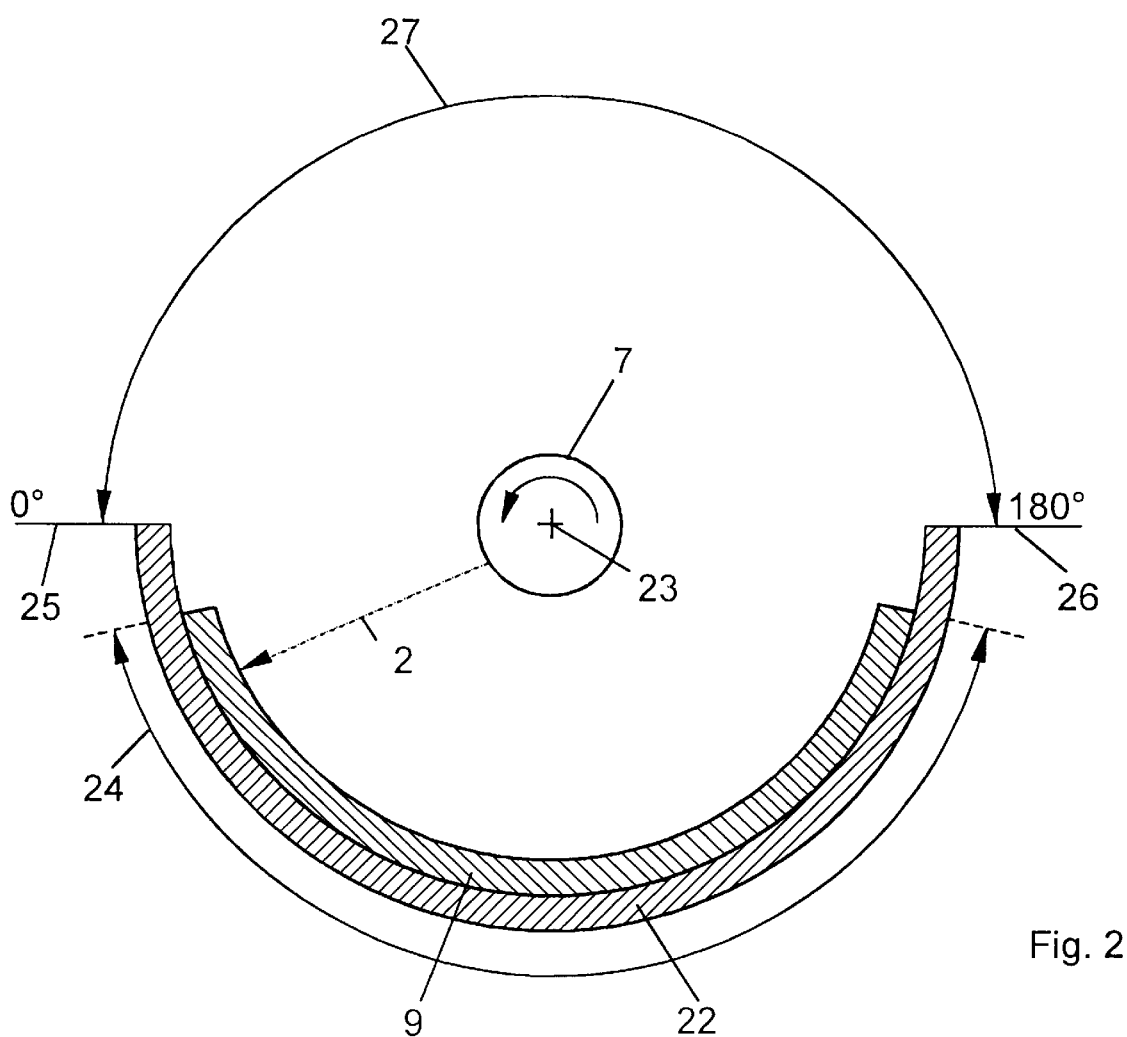
FIG. 2 is a schematic, sectional illustration of an exposure device on the inside drum type.

First, FIG. 2 shows a recorder of the inside drum type in a sectional view. Such an inside drum recorder comprises a cylindrical segment-shaped half shell or exposure trough 22 with an aperture angle of, for example, 180° in which the recording material 9 is fixed. The light beam deflection unit 7 rotates around the cylinder axis 23 of the exposure trough 22 and conducts the light beam 2 over the recording material 9 point-by-point and line-by-line in the direction of an arrow, whereby the light beam deflection means 7 moves in the direction of the cylinder axis 23.

The recording material (9) extends over an exposing region (24) inside the exposure trough (22). In every exposing period (line), the exposing region (24) identifies the exposure time span or, respectively, modulation time span in which the light beam (2) undertakes the exposure of a line on the recording material (9). The exposing region (24) begins following a start mark (25) at the aperture angle 0° and ends preceding an end mark (26) at the aperture angle 180°. A return region (27) that, given the indicated arrow direction, begins at the end mark (26) and ends at the start mark (25) identifies the return time span dead zone in which no exposing occurs and the light beam (2) is respectively conducted to the next line.

Figure 3:
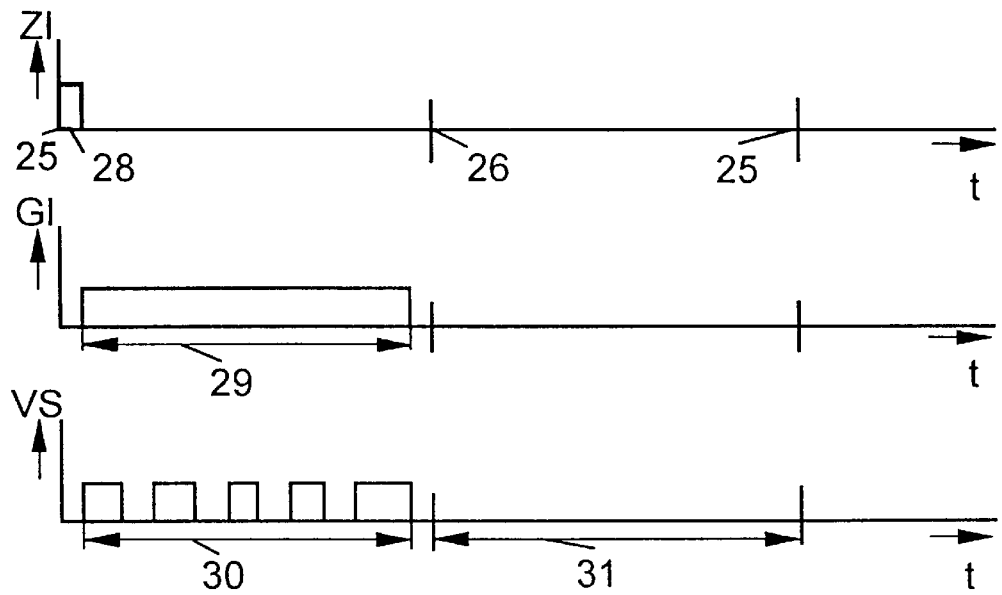
FIG. 3 shows time diagrams for illustrating the signal curves given deactivated temperature compensation (Prior Art)

FIG. 3 shows time diagrams for illustrating the time curve of the control signals for the optical isolator 4 and the video modulator 5 according to the prior art without the temperature compensation of the invention. A line start pulse (ZI) is generated at the start mark 25 for a time interval 28 within a line during the execution of the exposure. A gate pulse (GI) is forwarded to the optical isolator 4 in the time interval 29 chronologically offset relative to the line start pulse (ZI), this gate pulse (GI) switching the optical isolator 4 on, whereby the duration of the gate pulse (GI) corresponds to the length of a line or, respectively, to the exposing region 24. At the same time, the two-level video signal (VS) in the exposure time span 30 for the corresponding line is supplied to the video modulator 5, this signal (VS) switching the video modulator 5 on and off according to the respective signal level for exposing the line.

All signals lie in that time interval that lies between the start mark 25 and the end mark 26. Corresponding to the respective exposure sequence, the chronological lengths of the gate pulses (GI) and of the exposing time span 30 vary dependent on the respective length of the line or, respectively, of the exposing region 24.

Without temperature compensation, the optical isolator 4 is not switched on by additional gate pulses (GI) within the return time span 31 that corresponds to the return region 27, so that the operating temperature of the optical isolator 4 drops during the return time span 31.

Figure 4:
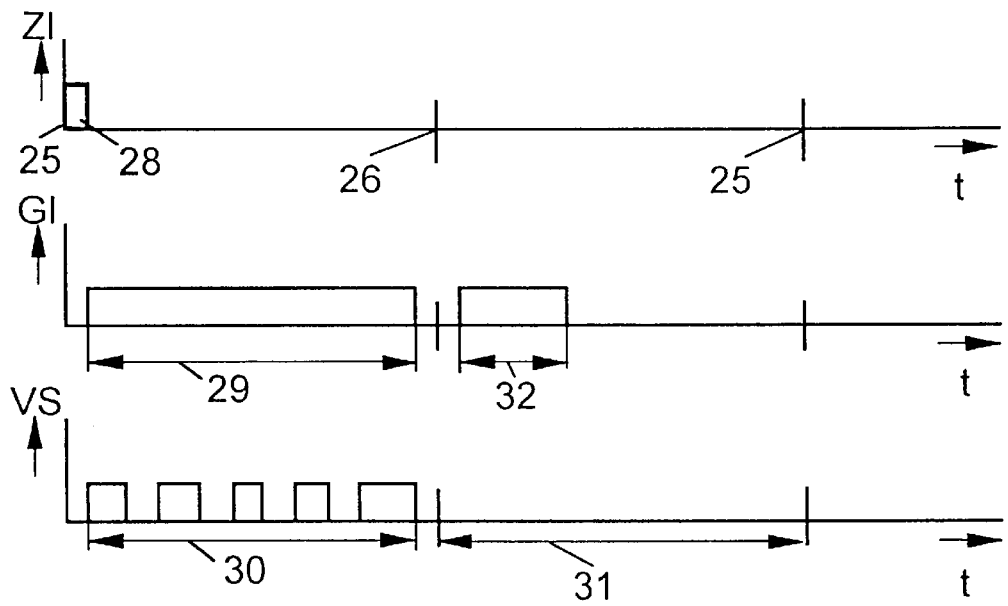
FIG. 4 shows time diagrams for illustrating the signal curves given activated temperature compensation according to the invention.

FIG. 4 shows time diagrams for illustrating the signal curves given activated temperature compensation for the optical isolator 4 according to the invention. A compensation time span 32 is provided within the return time span 31 in addition to the gate pulse (GI) within the time interval 29. The optical isolator 4 is additionally activated by a gate pulse (GI) of appropriate length within the compensation time span 32 so that it warms in the return time span 31 in order to keep the operating temperature of the optical isolator 4 nearly constant overall in the individual exposing periods, i.e. respectively in the exposing time spans 30 and the return time spans 31.

Given a time-variable duration of the exposing time span 30 or, respectively, given a time-variable duration of the gate pulse (GI) in every line, the compensation time span 32 is advantageously varied within the return time span 31 for the purpose of temperature compensation such that the sum of the time extents of the time interval 29 or, respectively, of the exposing time span 30 and of the compensation time span 32 is approximately constant in the lines. The particular aim is to achieve an exact constancy. However, an exact constancy is often not required in practice for adequately avoiding given parameter deviations due to temperature differences.

Figure 5:
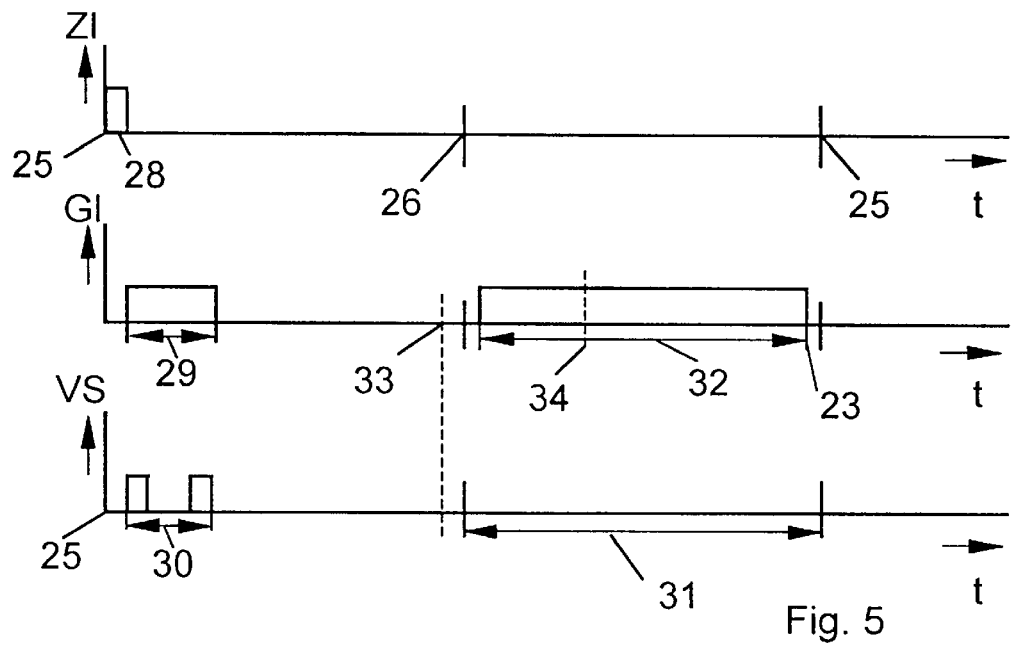
FIG. 5 illustrates time diagrams with signal curves modified compared to FIG. 4, whereby the duration of the exposure time span was shortened.

FIG. 5 shows time diagrams with signal curves modified compared to FIG. 4 wherein the duration of the time interval 29 for the gate pulse (GI) and of the exposing time span 30 is shortened but the duration of the compensation time span 32 is lengthened.

This leads to the end of the exposing time span 30 migrating farther toward the left on the time axis "t" and the end of the compensation time span 32 migrating farther toward the right. In order to make a comparison to FIG. 4 possible, the end of the exposing time span 30 of FIG. 4 is additionally entered in FIG. 5 as a broken line 33, and the end of the compensation time span 32 of FIG. 4 is entered as a broken line 34.

In FIG. 5 relative to FIG. 4, the compensation time span 32 has been lengthened by the time difference between the end of the compensation time span 32 and the broken line 34. This time span corresponds to the time difference between the broken line 33 and the end of the exposing time span 30. The sum of the time extents of exposing time span 30 and compensation time span 32 has thereby remained constant, as is preferred.

A constant heating of the optical isolator 4 is managed by this constancy of the activation time spans of the optical isolator 4. As a result thereof, positional changes of the light beam 2 due to temperature fluctuations are advantageously avoided. By keeping the heating of the optical isolator 4 constant, moreover, disturbing density changes on the recording material 9 given start/stop mode of the exposure unit are avoided, so that a high overall recording quality is achieved.

FIG. 6 shows an exemplary embodiment of the drive circuit 12 in the form of a block circuit diagram. The image signal BS on the line 13 is supplied to an editing stage 37 that is also input with the second reference clock sequence $T_2$ on the line 18 and with the line start pulses (ZI) on the line 20. The video signal (VS) on the line 11 and the gate pulses (GI) for the time interval 29 or, respectively, the exposing time span 30 on a line 38 are derived from the image signal (BS) in the editing stage 37. The video signal (VS) is supplied to the video modulator 5.

A counter 39 can be input via a loading input 40 with a presetting that is stored in a memory 41 and that can be potentially modified for adaptation to respective application demands. Over and above this, the counter 39 comprises a clock input 42, a start input 43 as well as a count input 44. The line start pulses (ZI) on the line 20 are applied to the start input 43 in order to initiate a loading process of the counter 39 with the pre-setting value stored in the memory 41. The gate pulses GI on the line 38 are adjacent at the count input 44.

During the time duration of the gate pulses (GI), the counter 39 counts its counter reading down from its pre-setting value in the clock of the reference clock sequence $T_2$ adjacent at the clock input 42. The current counter value is available at a counter output 45 and is forwarded to a comparator 46. The comparator 46 comprises a control input 47, a signal output 48 as well as a counter feedback 49.

A signal that informs the comparator 46 about whether the light beam deflection means 7 is already aligned to the return region 27 is adjacent at the control input 47. When this is the case, the comparator 46 compares whether the value "zero" is adjacent at the counter output 45 of the counter 39. When this is not the case, then the comparator 46 activates the additional gate pulses (GI) for the compensation time spans 32. At the same time, the counter 39 is initiated via the counter feedback 49 to continue to lower its counter reading. As a result thereof, the compensation time span 32 extends until the counter 39 has counted down to "zero". The gate pulses (GI) for the exposing time spans 30 on the line 38 generated in the editing stage 37 and the additional gate pulses (GI) for the compensation time spans 32 generated at the signal output 48 of the comparator 46 are operated with one another in an OR element 50 and are supplied to the optical isolator 4 via the line 10.

Via a potentially occuring pre-setting of the comparator 46, it can be prescribed that the compensation time span 32 does not begin immediately follow the end mark 26 but that a predefinable distance is realized.

The exact time positioning of the gate pulses (GI) is determined by the required length of exposure within the lines and by the starting position of the lines. As warranted, the time interval 29 can begin somewhat earlier and end somewhat later compared to the exposing time span 30 in order to compensate inertia effects of the optical isolator 4 with a lead and a lag and in order to assure that back reflections are avoided with the optical isolator 4 at least during the exposing time span (30).

It lies within the scope of the invention to implement the temperature compensation not only at the optical isolator 4, as described, but in general at every modulator that is respectively activated in exposing time spans and deactivated in following return time spans for the light beam. In this case, the on intervals of the modulator are respectively determined in an exposing time span with reference to the video signal, and the modulator is switched on in the following return time span for a compensation time span that corresponds to the sum of the identified on-time intervals of the modulator.

Although various minor changes and modifications might be proposed by those skilled in the art, it will be understood that our wish is to include within the claims of the patent warranted hereon all such changes and modifications as reasonably come within our contribution to the art.

We claim as our invention:

1. A method for exposing recording material, comprising the steps of:

generating a light beam with a light source;

passing the light beam through an optical isolator and through a modulator, the modulator modulating the light beam;

exposing the recording material point-by-point and line-by-line by the modulated light beam, the modulator being activated during the exposing of each line in an exposing time span, the modulator being deactivated at least at times within a return time span for the light beam associated with each line, and wherein the exposing time span has different time extents for at least a few different lines;

preventing back reflection of light from interfering with the light source by activating the optical isolator during said exposing time span, the activation of the optical isolator causing heat to be generated therein; and compensating for parameter fluctuations due to different operating temperatures of the optical isolator caused by said heat by implementing an activation of the optical isolator during a compensation time span which falls within said return time span for each line, and providing that a sum of time extents of the exposing time span and of the compensation time span is approximately constant for each line.

2. The method according to claim 1 wherein a laser is employed as said light source.

3. The method according to claim 1 wherein the modulator is operated as a video modulator that is controlled by a video signal carrying information to be recorded.

4. The method according to claim 1 wherein the modulator is an acousto-optical modulator.

5. The method according to claim 1 wherein the optical isolator is operated as an acousto-optical modulator of a 1st order.

6. The method according to claim 1 wherein the modulator is operated as an acousto-optical modulator of a 0th order.

7. The method according to claim 1 wherein the optical isolator prevents disturbing back reflections from the video modulator and a light deflection unit which deflect the light into the recording material by detuning wavelengths of the back reflected light.

8. The method according to claim 1 wherein the optical isolator shuts the light beam directed onto the recording material completely off during pauses in respective exposures.

9. The method according to claim 1 wherein a time duration of the compensation time span is prescribed by a counter which, proceeding from a loaded starting value, is counted down during the exposing time span, and such that, following a start of the compensation time span continues to be counted down to a prescribed ending value, and wherein an end of compensation of the compensation time span is controlled when the prescribed ending value is reached.

10. A method for exposing recording material, comprising the steps of:

generating a light beam with a light source;

passing the light beam through an optical isolator and through a modulator, the modulator modulating the light beam;

exposing the recording material point-by-point and line-by-line by the modulated light beam, the modulator being activated during the exposing of each line in an exposing time span;

preventing back reflection of light from interfering with the light source by activating the optical isolator during said exposing time span, the activation of the optical isolator causing heat to be generated therein; and compensating for at least one parameter fluctuation due to said heat activating the optical isolator during a compensation time span which falls within a return time span for the light beam for each line, and providing that a sum of time extents of the exposing time span and of the compensation time span is approximately constant for each line.

11. An apparatus for exposing recording material, comprising:

a light source for generating a light beam;

a video modulator in a beam path of the light source for modulation of the light beam dependent on a video carrying information to be exposed;

a holder for the recording material;

a drive circuit connected to the video modulator for activating video during an exposing time span for each line being exposed on the recording material, and for deactivating the video at least at times within a return time span for the light beam after exposing each line;

a synchronization system for synchronization of the exposing connected to the recording element and the drive circuit;

an optical isolator that can be switched on and off by the drive circuit in the light path between the light source and the video modulator; and the drive circuit activating the optical isolator for a compensation time span during the return time span in which the optical isolator heats up, a sum of time extents of the exposing time span and of the compensation time span being approximately constant for each line.

12. The apparatus according to claim 11 wherein the optical isolator comprises an acousto-optical modulator of a 1st order.

13. The apparatus according to claim 11 wherein the video modulator comprises an acousto-optical modulator of a 0th order.

14. The apparatus according to claim 11 wherein the recording element comprises a rotating light beam deflection unit for deflecting the modulated light beam onto the recording material.

15. The apparatus according to claim 11 wherein the light source comprises a laser light source.

16. The apparatus according to claim 11 wherein the optical isolator is connected to the drive circuit provided with a counter loaded with a starting value and is connected to the synchronizing circuit for counting a current counter reading both during the exposing time span as well as during the compensation time span, and said counter prescribes the time extent of the compensation time span within a return region with the current counter reading thereof.

17. A method for exposing a recording material, comprising the steps of:

generating a light beam with a light source;

passing the light beam through a first modulator and a second modulator;

said first modulator being employed as an optical isolator for preventing disturbing back reflections of the light beam from the second modulator back to said light source;

said second modulator being switchable by a video signal for modulating said light beam;

exposing the recording material point-by-point and line-by-line by said modulated light beam, the second modulator being activated in an exposing time span for each line and being deactivated after exposure of each line in a return time span for the light beam during each exposure time period;

said first modulator being switchable by an electrical control signal for switching the light beam completely off during pauses in respective exposures; and compensating fluctuations of the first modulator in an operating temperature due to the switching operation of the first modulator by implementing an activation of the first modulator during a compensation time period which falls within said return time span for each line and providing that a sum of time extents of the exposing time span and of the compensating time span is approximately constant for each line.

* * * * *